United States Patent [19]

Suizu

[11] Patent Number: 5,087,977
[45] Date of Patent: Feb. 11, 1992

[54] CHANNEL SELECTING APPARATUS AUTOMATICALLY DETECTING DIFFERENT MODES OF TELEVISION SIGNALS

[75] Inventor: Katsuto Suizu, Saitama, Japan

[73] Assignee: Kabushiki Kaisha Toshiba, Kawasaki, Japan

[21] Appl. No.: 461,037

[22] Filed: Jan. 4, 1990

[30] Foreign Application Priority Data

Jan. 10, 1989 [JP] Japan .................................. 1-3359

[51] Int. Cl.⁵ ............................................. H04N 5/50
[52] U.S. Cl. ............................ 358/193.1; 358/195.1; 455/182
[58] Field of Search ............... 358/195.1, 191.1, 193.1, 358/86; 455/182, 192

[56] References Cited

U.S. PATENT DOCUMENTS

| | | | |
|---|---|---|---|
| 4,422,096 | 12/1983 | Henderson | 358/191.1 |
| 4,485,404 | 11/1984 | Tults | 358/195.1 |
| 4,689,685 | 8/1987 | Testin et al. | 358/195.1 |
| 4,763,195 | 8/1988 | Tults | 358/195.1 |
| 4,868,892 | 9/1989 | Tults et al. | 358/195.1 |
| 4,914,516 | 4/1990 | Duffield | 358/195.1 |
| 5,034,819 | 7/1991 | Tsukagoshi | 358/193.1 |

Primary Examiner—James J. Groody
Assistant Examiner—Jeffery S. Murrell
Attorney, Agent, or Firm—Cushman, Darby & Cushman

[57] ABSTRACT

A channel selecting apparatus for television receiving apparatus and the like which memorizes channel data (about whether signals are present or not in respective channels) in a memory circuit connected to an operating circuit preparing channel selecting data. The received frequency is tuned with the broadcast signal input into an antenna terminal and is then confirmed and analyzed. This is used to determine whether the broadcast signal input into the antenna terminal is a TV signal or CATV signal and whether the CATV signal is of an STD, HRC or IRC system and the receiving mode is automatically determined.

5 Claims, 6 Drawing Sheets

CHANNEL SELECTING APPARATUS AUTOMATICALLY DETECTING DIFFERENT MODES OF TELEVISION SIGNALS

BACKGROUND OF THE INVENTION

1 Field of the Invention

This invention relates to a channel selecting apparatus for a color television receiving apparatus or the like which has an improved operability:

2 Description of the Related Art

FIG. 5 is a block diagram showing the formation of a general television receiving apparatus. In this diagram, a television (called TV hereinafter) wave received by an antenna 1 is amplified, has the frequency converted selectively for only a specific channel in a tuner 2, is further amplified by a video intermediate frequency circuit 3, has the video signal and audio signal detected and is demodulated. The audio signal is made to be on a sufficient signal level by an audio amplifying circuit 4 and is reproduced by a speaker 5. The video signal is projected as an image by a cathode ray tube 7 through a video amplifying circuit 6.

Said tuner 2 is a so-called tuning circuit and has a function of selecting a specific frequency. The tuning frequency is determined by varying the value of the capacity component forming the tuning circuit. In fact, a local oscillator within the tuner 2 is formed to be of a voltage controlled oscillator (VCO) type using a varactor diode (variable capacity diode) in which the capacity value is variable by the voltage. The VCO is controlled by a controlling voltage from a channel selecting circuit 8. The channel selecting circuit 8 forms a channel selecting apparatus by a well known PLL frequency synthesizer system together with an operating circuit 9. The channel selection is directed to the channel selecting circuit 8 by the user through the operating circuit 9 from an input circuit 11. The operating circuit 9 has a function of operating the frequency dividing ratio (N) of a programable frequency divider within the channel selecting circuit 8 in response to the designated channel. When the frequency dividing ratio (N) is varied, the operating circuit 9 will vary the controlling voltage given to the VCO within the tuner 2 from the channel selecting circuit 8 and will vary the local oscillation frequency of the tuner 2 so that the tuner 2 may select the designated channel. In the operating circuit 9, the information required to operate the frequency dividing ratio (N) is obtained from a memory circuit 10 and, as the information, an automatic fine tuning signal (called an AFT signal hereinafter) 12 and synchronizing signal (called a SYNC signal hereinafter) 13 from the video intermediate frequency circuit 3 are used. The AFT signal 12 gives the information of a difference from the prescribed frequency of the carrier frequency in a video intermediate frequency signal (called an IF signal hereinafter) at the time of selecting the channel. Also, the AFT signal 12 gives the information as to whether there is a television broadcasting signal or not together with the SYNC signal 13. U.S. Pat. No. 4,422,096 (the inventor is John G. N. Henderson) shows an example of a channel selecting apparatus of a PLL frequency synthesizer system using an AFT signal, and also recently, such channel selecting information as, for example, a receiving channel number is combined as a character signal 14 with a video signal in the video amplifying circuit 6 and is displayed in the cathode ray tube 7.

In such formation, when the user directs such channel selection as channeling up from the present receiving channel in the input circuit 11, the channel data (that is, the frequency dividing ratio data) may be increased by one channel in the operating circuit 9 and a direction may be given to the channel selecting circuit 8. However, recently, there is a system wherein a channel having a broadcast (called a signal having channel) is memorized in the memory circuit 10 in advance so that, when the channel selection of the above mentioned channeling up is directed, the information in the memory circuit 10 may be read out and the next signal having channel may be quickly received. Also, recently, both broadcast signals can be received in order that the signal supplied to the tuner 2 may be supplied with either a TV broadcast signal or a CATV broadcast signal and may be switched by the user through the input circuit 11. That is to say, the operating circuit 9 acts to determine the received frequency by the mode (that is, the TV mode or CATV mode) determined by the user.

FIG. 6 is an explanatory view showing the frequency arrangements of channels (abbreviated as CH's hereinafter) of a TV broadcast and CATV broadcast. In FIG. 6, (a) shows the frequency arrangement of TVCH's and (b) shows the frequency arrangement of CATVCH's. The frequency bands of the video carriers of 2CH to 13CH of the TV coincide with the frequency bands of the video carriers of 2CH to 13CH of the STD broadcast of the CATV. In the other CH's, the frequency of the TVCH and the frequency of the CATVCH do not coincide with each other. That is to say, the 14CH to 69CH of the TV and the A8CH to A1CH, ACH to WCH, AACH to BBBCH and 65CH to 125CH of the CATV are CH's of frequency bands peculiar respectively to the TV and CATV. If the receiving apparatus is set, for example, at the CATV mode, a memory address fitted to the CH arrangement of the CATV will be set in the memory circuit 10 to memorize the data as to whether signals are present or not in the respective channels and to receive the next signal having channel for the direction of such channel selection as channeling up.

Table 1 shows an example of the arrangement of data as to whether signals to be memorized in said memory circuit 10 are present or not in the respective CH's of the TV. Table 2 shows an example of the arrangement of data as to whether signals in said memory circuit 10 are present or not in the respective CH's of the CATV. The mark ○ represents that the signal is present and the mark x represents that the signal is not present.

TABLE 1

| CH | Whether the signal is present or not. |
|---|---|
| 2 | ○ |
| 3 | x |
| 4 | ○ |
| 5 | x |
| , | , |
| , | , |
| , | , |
| , | , |
| 68 | x |
| 69 | ○ |

TABLE 2

| CH | Whether the signal is present or not. |
|---|---|
| 2 | ○ |
| 3 | ○ |
| 4 | x |
| 5 | x |
| , | , |
| , | , |
| , | , |
| , | , |
| , | , |
| 124 | ○ |
| 125 | ○ |

By the way, in the CATV broadcast, from the frequency relation with the TV signal, various CATV broadcasting systems are practiced and, even at present, there are several kinds of systems. In the CATV broadcast in the United States, there are three broadcasting systems of an STD broadcast, HRC broadcast and IRC broadcast. Table 3 shows video carrier frequencies (in $MH_z$) of respective channels of the three CATV broadcasting systems. Table 4 shows video carrier frequencies (in $MH_z$) of respective channels of the TV broadcast.

TABLE 3

| CH | STD broadcast | HRC broadcast | IRC broadcast |
|---|---|---|---|
| 2 | 55.25 | 54.00 | 55.25 |
| 3 | 61.25 | 60.00 | 61.25 |
| 4 | 67.25 | 66.00 | 67.25 |
| 5 | 77.25 | 78.00 | 79.25 |
| 6 | 83.25 | 84.00 | 85.25 |
| , | , | , | , |
| , | , | , | , |
| , | , | , | , |
| , | , | , | , |
| 7 | 175.25 | 180.00 | 175.25 |
| 8 | 181.25 | 186.00 | 181.25 |
| 9 | 187.25 | 192.00 | 187.25 |
| 10 | 193.25 | 198.00 | 193.25 |
| 11 | 199.25 | 204.00 | 199.25 |
| 12 | 205.25 | 210.00 | 205.25 |
| 13 | 211.25 | 216.00 | 211.25 |
| , | , | , | , |
| , | , | , | , |
| 65 | 469.25 | 468.00 | 469.25 |
| 66 | 475.25 | 474.00 | 475.25 |
| 67 | 481.25 | 480.00 | 481.25 |
| , | , | , | , |
| , | , | , | , |
| , | , | , | , |
| 123 | 787.25 | 786.00 | 787.25 |
| 124 | 793.25 | 792.00 | 793.25 |
| 125 | 799.25 | 798.00 | 799.25 |

TABLE 4

| CH | TV broadcast |
|---|---|
| 2 | 55.25 |
| 3 | 61.25 |
| 4 | 67.25 |
| 5 | 77.25 |
| 6 | 83.25 |
| 7 | 175.25 |
| 8 | 181.25 |
| 9 | 187.25 |
| 10 | 193.25 |
| 11 | 199.25 |
| 12 | 205.25 |
| 13 | 211.25 |
| 14 | 471.25 |
| 15 | 477.25 |
| 16 | 483.25 |
| , | , |
| , | , |
| 67 | 789.25 |
| 68 | 795.25 |
| 69 | 801.25 |

In the light of the Tables 3 and 4, on the TV broadcast and CATV broadcast, the broadcast frequency of the 2CH to 13CH of the TV and the broadcast frequency of the 2CH to 13CH of the STD broadcast of the CATV are the same. On the three broadcasting systems of the CATV, the broadcast frequencies of the 5CH and 6CH in the respective broadcasts of the STD broadcast, HRC broadcast and IRC broadcast are different. For example, the frequency of the 5CH is 77.25 $MH_z$ in the STD broadcast, 78 $MH_z$ in the HRC broadcast and 79.25 $MH_z$ in the IRC broadcast. It is found that the broadcast frequency is different depending on the broadcasting system. The same can be said also on the 6CH.

The relations of the broadcast frequencies of the TV, STD, HRC and IRC are shown in FIG. 7. As shown in FIG. 7(a), on the 5CH and 6CH, as described above, the respective broadcast frequencies of the STD, HRC and IRC are different. If the broadcast frequency of the STD is represented by fSTD, the broadcast frequency fHRC of the HRC will be fHRC=fSTD+0.75 $MH_z$, the broadcast frequency fIRC of the IRC will be fIRC=fSTD+2$MH_z$ and the broadcast frequency fTV of the TV will be fTV=fSTD. Also, as shown in FIG. 7(b), on the other CH's than the 5CH and 6CH, the broadcast frequency fHRC of the HRC is fHRC=fSTD−1.25 $MH_z$ and the broadcast frequency fIRC of the IRC is fIRC=fSTD=fTV.

As such are the frequency relations, in the above described TV receiving apparatus which can receive the TV broadcast and CATV broadcast, the selection of the TV broadcast signal and CATV broadcast signal is complicated but a TV receiving apparatus provided with four receiving modes of the TV, STD, HRC and IRC is already practiced.

In the TV receiving apparatus provided with a plurality of such receiving modes, after the user sets the operating circuit 9 in the respective modes through the input circuit 11, CH data (data as to whether signals are present or not) in the memory circuit 10 will be automatically set.

FIG. 8 shows a flow chart of the operation of setting CH data in the memory circuit 10 after the receiving mode is set. By setting the receiving mode, the memory address in the CH arrangement of the CATV or TV is set in the memory circuit 10 and the process shifts to the CH data setting operation in FIG. 8. In the steps S1 to S4, first the CH is selected, whether a signal is present or not in the CH is judged, if a signal is present, data showing that a signal is present will be written into the memory circuit 10 but, if no signal is present, data showing that no signal is present will be written into the memory circuit 10. Thereafter, as shown in the steps S5 and S6, the process of increasing CH's and returning to the step S1 is repeated but, before that, whether the data have been written in is judged on all the CH's and, if they have been written in on all the CH's, the process will end.

Now, in the conventional TV receiving apparatus wherein signals can be received in a plurality of modes and, after the receiving mode is set, the CH data will be automatically set. In the case of selecting the channel of the television signal, the user will confirm in advance whether the signal connected to the antenna terminal is a TV signal or CATV signal and of which broadcasting system the CATV signal is and then will have to set the receiving mode of the receiving apparatus to be used. Thus, there has been a problem that the operability of the apparatus is low.

SUMMARY OF THE INVENTION

An object of the present invention is to provide a channel selecting apparatus wherein the mode of a broadcast signal to be connected to an antenna terminal is automatically judged, the receiving mode of the television apparatus can be automatically set and the operatability in the channel selecting operation is high.

Another object of the present invention is to provide a channel selecting apparatus wherein the now connected broadcast signal receiving mode is automatically determined and, at the same time, CH data (data as to whether signals are present or not) for a memory circuit can be automatically set.

That is to say, the channel selecting apparatus of the present invention is characterized by comprising:

a tuner selectively amplifying a television signal fed to an antenna terminal and converting the frequency;

a video intermediate frequency circuit amplifying and detecting the signal from this tuner;

a channel selecting circuit determining to select a specific television signal for said tuner;

an input circuit giving a channel selecting instruction to this channel selecting circuit;

a memory means for memorizing data required to select the channel; and an operating means whereby channel selecting data are fed to said channel selecting circuit by using the data from said input circuit and the AFT signal and SYNC signal from said video intermediate frequency circuit and, in the case of memorizing channel data (data as to whether signals are present or not) for selecting the channel in said memory means, the television signal to be fed to said tuner is well tuned by using said AFT signal and SYNC signal, then the received frequency is confirmed and analyzed, the broadcasting system of the television signal input into said antenna terminal is judged from the feature of the received frequency and the receiving mode is determined.

DETAILED DESCRIPTION OF THE PREFERRED EMBODIMENTS

Figure 1:
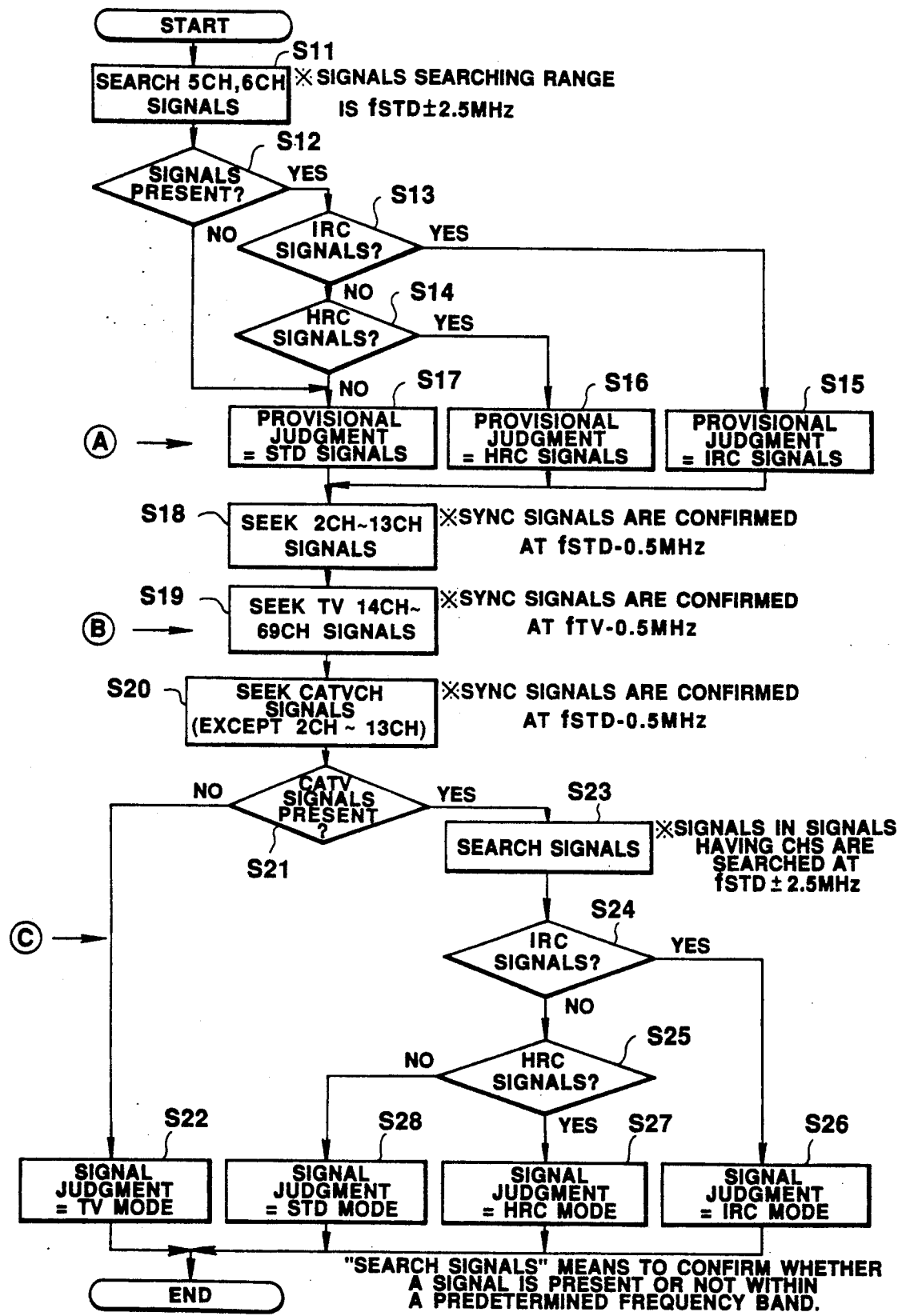
FIG. 1 is a flow chart for explaining the first embodiment of the processing operation in the channel selecting apparatus according to the present invention.
Figure 5:
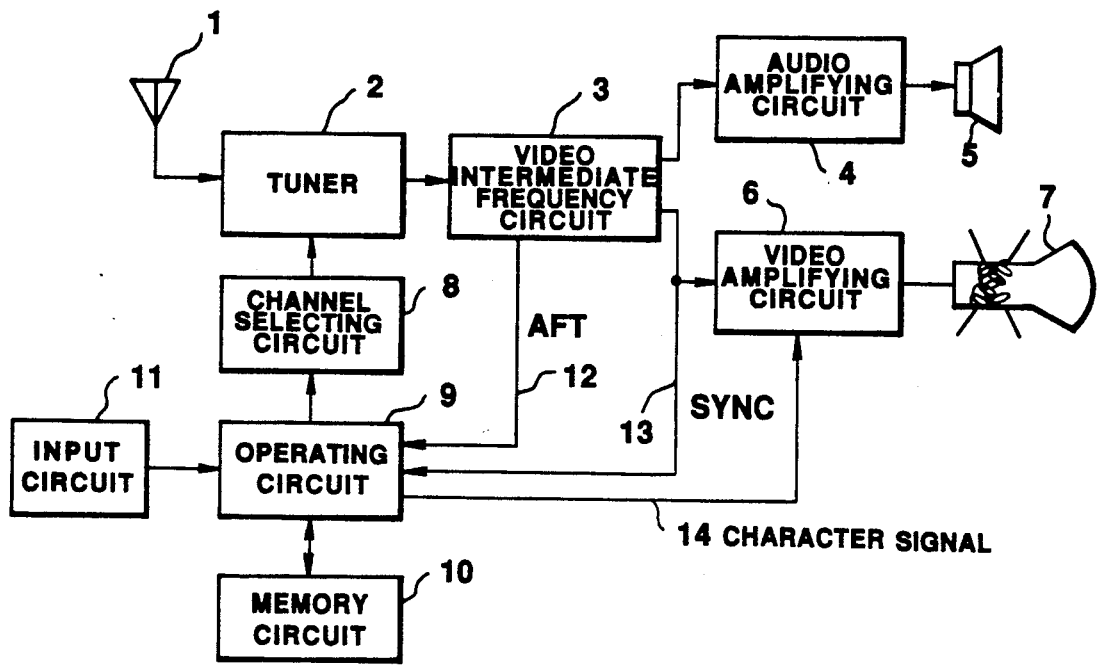
FIG. 5 is a block diagram showing a television receiving apparatus to which the present invention is applied.
Figure 6:
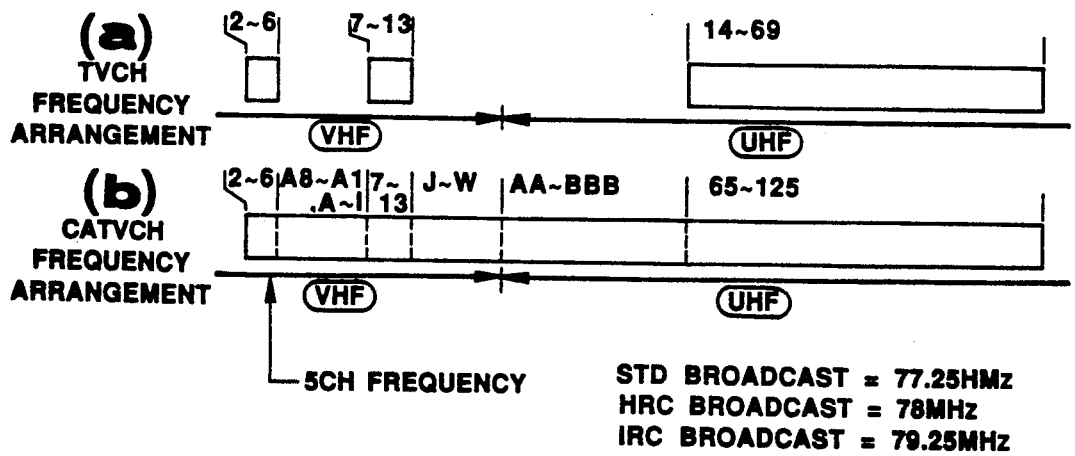
FIG. 6 is an explanatory view showing channel frequency arrangements of the TV and CATV.

FIG. 1 is a flow chart showing the first embodiment of the processing operation in the channel selecting apparatus according to the present invention. The block diagram of the television receiving apparatus in which the channel selecting apparatus of this embodiment is used is the same as is shown in FIG. 5.

Figure 7:
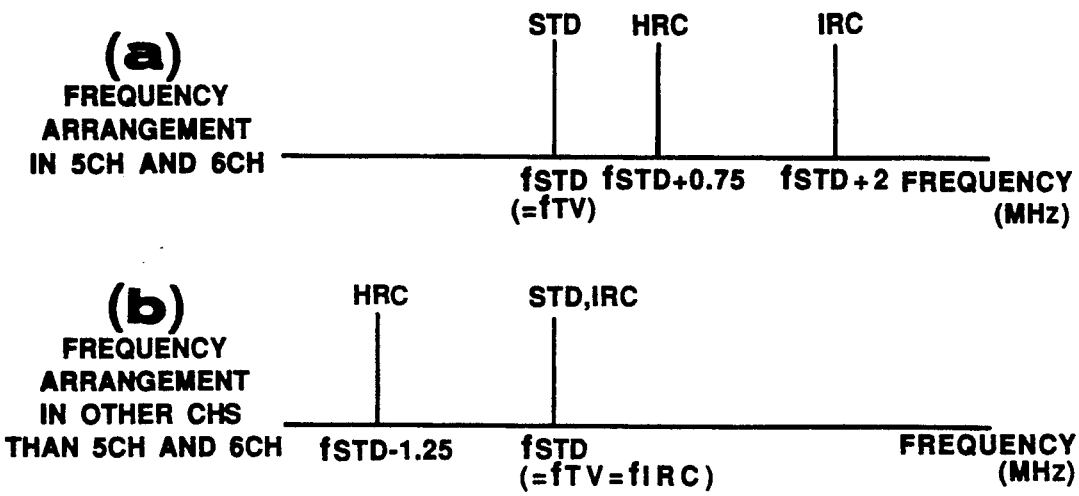
FIG. 7 is an explanatory view showing the relations of the channel frequencies of the respective broadcasts of the TV, STD, HRC and IRC.
Figure 8:
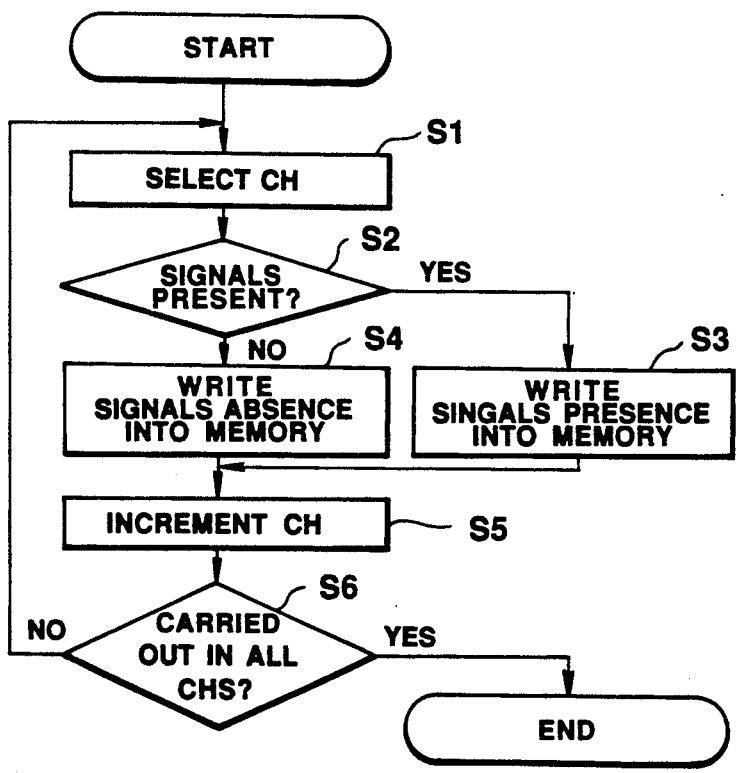
FIG. 8 is a flow chart for explaining the channel selecting process in the prior art.

When an operation is directed of setting data (called CH data hereinafter) showing whether signals are present or not in areas alotted to respective CH's in the memory circuit 10 in FIG. 5, (this may be automatically carried out under some condition, for example, simultaneously with switching on a power switch), first, as shown by the step S11, signals are searched within the bands of the 5CH and 6CH. More specifically, at this time the frequency dividing ratio data from the operating circuit 9 in FIG. 5 will be varied in fixed ranges (respective frequency ranges of the 5CH and 6CH) to vary the controlling voltage of the channel selecting circuit 8 and to thereby sweep the local oscillated frequency of the tuner 2. Here, signals are searched first on the 5CH and 6CH because, as shown in FIGS. 7(a) and (b), only on the 5CH and 6CH, the three broadcast frequencies of the STD, HRC and IRC are different. If the CH frequency of the STD signal is fSTD, the signal searching range at this time will be fSTD $\pm 2.5$ MH$_z$ because, in the searching range of $\pm 2.5$ MH$_z$, the broadcast frequencies of all of the TV, STD, HRC and IR can be covered. As in the above, in the step S11, the signals are searched in the bands of the 5CH and 6CH and, in the step S12, it is confirmed whether signals are present or not in the 5CH and 6CH. In case signals are present, as shown in the steps S13 and S14, an operation will be made to confirm the received frequency. In the steps S13 and S14, the received frequency is confirmed on the IRC signal by whether it is tuned with fSTD+2 MH$_z$ and on the HRC signal by whether it is tuned with fSTD+0.75 MH$_z$. Therefore, at this time, the AFT signal 12 and SYNC signal 13 shown in FIG. 5 will be used and will have to be substantially perfectly tuned with the broadcast signal.

Thus, in case signals are present, in the steps S13 and S14, by confirming the signal frequency, the kind (that is, the mode) of the broadcast can be judged. That is to say, in the step S13, if the IRC signal is confirmed, as in the step S15, the mode will be able to be judged to be of the IRC signal and, in the step S14, if the HRC signal is confirmed, as in the step S16, the mode will be able to be judged to be of the HRC signal. In the step S12, in case no signal is present and, in the steps S13 and S14, in case no signal frequency can be confirmed, as shown in the step S17, the mode will be provisionally judged to be of the STD signal. Thus, the mode will be provisionally judged to be of the STD signal because, in case no signal can be confirmed in the steps S13 and S14, there will be the case of the TV signal besides the case of the STD signal. All the judgments in the stage A of the steps S15, S16 and S17 are made provisional judgments. Thus, in the stage A, the judgments are made provisional judgments because, when no broadcast signal is present in the 5CH and 6CH in the step S12, the mode will not be able to be determined finally in the stage A.

Then, as shown in the step S18, signals in the 2 CH to 13 CH are sought. In this case, with (fSTD−0.5 MH$_z$), it is judged whether the SYNC signal is output or not. It is not known whether the broadcast signal confirmed in this step S18 is of the TV broadcast or of the CATV broadcast (that is, of any of the TV, STD, HRC and IRC).

By the way, the SYNC signal can be confirmed with (fSTD−0.5 MH$_z$), because generally, in the TV receiving apparatus, in case the frequency of the TV signal is fTV, even when the tuning of the tuner lags, the SYNC signal will be detected within the range of (fTV±1 MH$_z$). For example, even if the tuning frequency of the tuner is (fTV−0.5 MH$_z$) in the STD signal and IRC signal and (fTV+0.25 MH$_z$) in the HRC signal, the SYNC signal will be detected with these frequencies and thereby signals will be able to be well detected.

Thus, CH data are determined by confirming whether signals are present or not in the 2CH to 13CH. The CH data are stored in the memory circuit 10 shown in FIG. 5. The thus stored CH data as to whether signals are present or not can be utilized later as data as to whether signals are present or not when a signal having channel is to be quickly selected.

Then, as shown in the step S19, signals in the 14 CH to 69 CH which are bands peculiar to the TV are sought, whether signals are present or not is confirmed and CH data are stocked. The confirmed frequency in this case may be near the center frequency fTV of the TV but, in respect of the sensitivity, it is proper to confirm whether the SYNC signal is present or not at (fTV−0.5 MH$_z$).

Further, as shown in the step S20, signals in the bands peculiar to the CATV except the 2CH to 13CH are sought and whether signals are present or not is confirmed. At this time, too, whether a SYNC signal is present or not is confirmed with (fSTD−0.5 MH$_z$) and CH data are stocked. Thereby, the confirmation of whether signals are present or not in all the bands of the TV and CATV has ended.

Then, the receiving mode can be finally determined. Therefore, in the step S21, whether signals are present or not in the bands peculiar to the CATV is judged on the basis of the results of seeking the signals in the step S20 and, if no signal is present over all the bands peculiar to the CATV, the TV mode will be determined (step S22). If any signal is present in the bands peculiar to the CATV in the judgment in the step S21, as shown in the step S23, signals in the signal having CH's will be searched. At this time, too, signals are searched with the band (fSTD±2.5 MH$_z$). Then, in the steps S24 and S25, it is judged whether the searched signal is an IRC signal or HRC signal. At this time, too, whether it is an IRC signal or HRC signal can be confirmed by whether they tune with (fSTD+2 MH$_z$) or (fSTD+0.75 MH$_z$) or not in 5CH and 6CH. Thus, in the steps S24 and S25, the signal is substantially perfectly tuned and the received frequency is confirmed. Finally, as shown in the steps S26 to S28, the IRC mode, HRC mode or STD mode is determined.

At the time point when the receiving mode is determined as in the above, the CH data as to whether signals are present or not in the 2CH to 13CH in the above mentioned step S18 will be found to be data of which of the broadcasts of the TV, STD, HRC and IRC. These CH data can be utilized as data at the time of selecting a signal having CH as they are together with the CH data in the step S19 or S20.

According to the embodiment in FIG. 1, both of setting the receiving mode and setting (judging whether signals are present or not) the CH data in that mode can be made simultaneously and automatically.

By the way, in FIG. 1, the "search signals" means to confirm whether a signal is present or not within a band (fSTD±0.25 MH$_z$) and the "seek signals" means to confirm whether a signal is present or not in the designated frequency.

By the way, in FIG. 1, if the provisional judgment made in the stage A in which it is confirmed whether signals are present or not in the 5CH and 6CH is of an IRC signal or HRC signal, this provisional judgment will be able to be made a final judgment as it is and therefore, in this case, the steps S21 to S28 will be able to be omitted.

Figure 2:
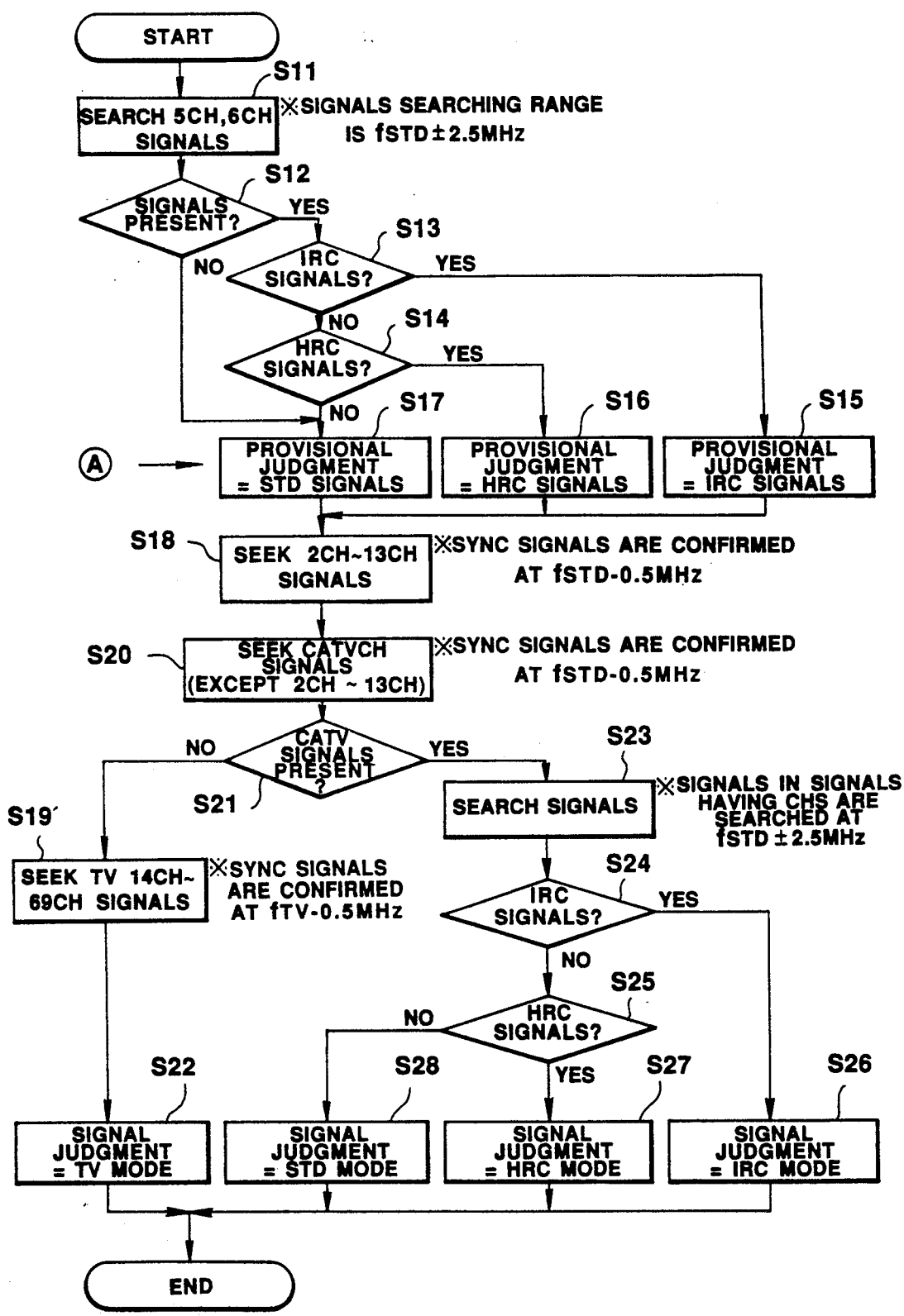
FIG. 2 is a flow chart for explaining the second embodiment of the processing operation in the channel selecting apparatus according to the present invention.

By the way, in the step S19 in FIG. 1, the TV signal is sought and the data are stocked so as to be utilized as CH data as to whether signals are present or not when a signal having channel is to be quickly selected later the same as in the step S18 (and step S20). Therefore, the operation shown by the reference symbol B corresponding to the step S19 may be in the position shown by the reference symbol C. FIG. 2 shows its flow chart as a second embodiment.

In FIG. 2, only the position of the step S19 is different from that in FIG. 1. That is to say, in the step S18, signals in the 2CH to 13CH are sought and data as to whether signals are present or not are stocked in the memory circuit and then, in the step S20, signals in the CH's (except the 2CH to 13CH) of the bands peculiar to the CATV are sought and data as to whether signals are present or not are stocked. In the step S21, it is judged whether signals are present or not in the bands peculiar to the CATV and, if no CATV signal is present, signals in the TV 14CH to 69CH are sought as shown in the step S19', data as to whether signals are present or not are stocked in the memory circuit and the TV mode is determined (step S22). By the way, in case it is judged in the step S21 that no CATV signal is present, the stock data at the time of seeking signals in the 2 CH to 13 CH in the step S18 can be judged to be the data of the 2 CH to 13 CH of the TV and can be utilized as CH data of the TV at the time of selecting channels.

Even in the embodiment in FIG. 2, both of setting the receiving mode and setting (judging whether signals are present or not) the CH data in that mode can be made simultaneously and automatically.

Figure 3:
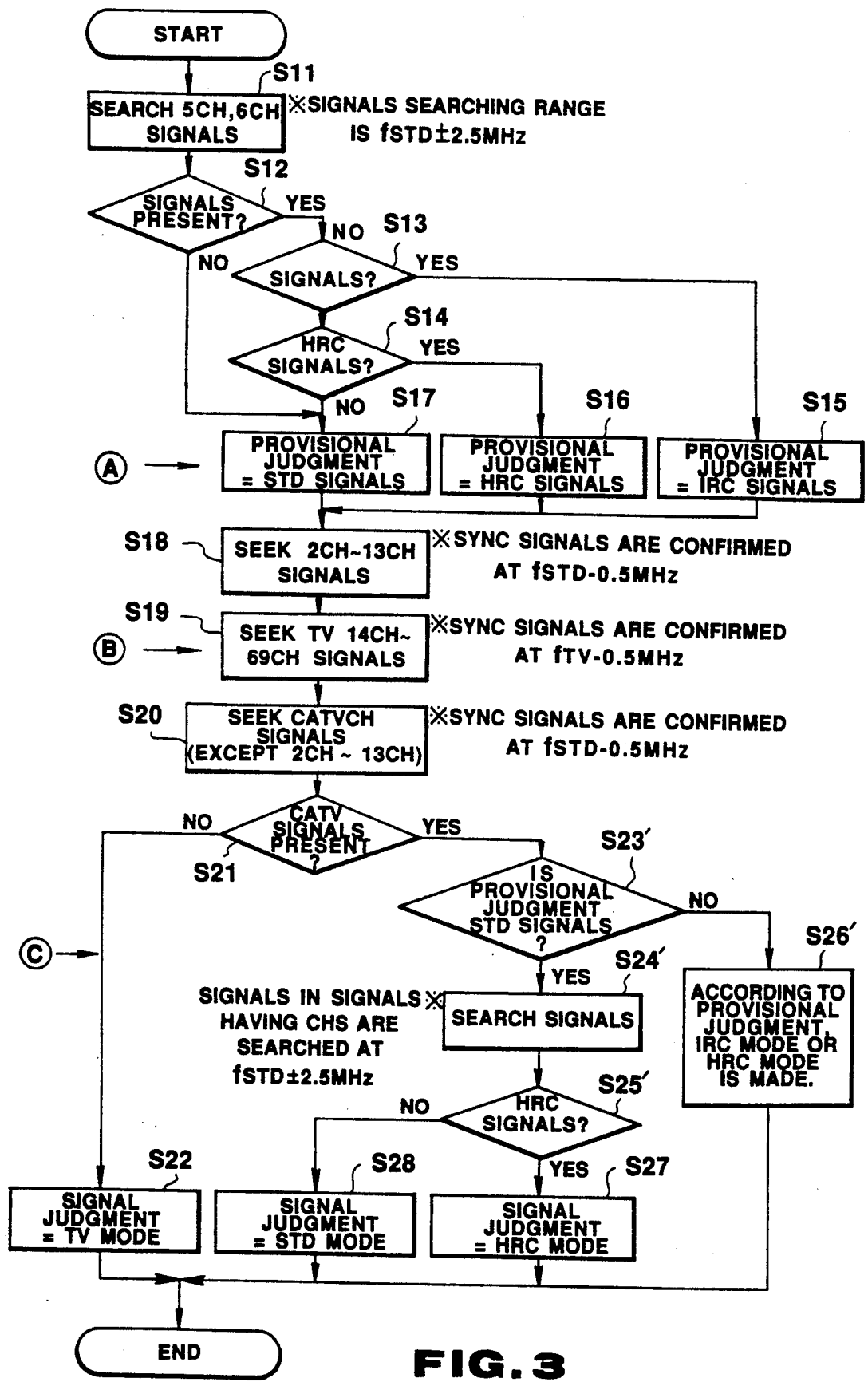
FIG. 3 is a flow chart for explaining the third embodiment of the processing operation in the channel selecting apparatus according to the present invention.

FIG. 3 is a flow chart showing the third embodiment of the present invention.

The embodiment shown in this chart is to use the results of the provisional judgments in the steps S15 to S17 to make final judgments in and after the step S23. Therefore, the difference from the embodiment in FIG. 1 in and after the step S23 shall be explained. As a result of seeking the signal in the step S20, in case a CATV signal is present in the step S21, as shown in the step S23', it is judged whether the provisional judgments in the steps S15 to S17 have been of STD signals or not. When the above mentioned provisional judgments are not of STD signals, they will be of IRC signals or HRC signals and therefore, as shown in the step S26', according to the provisional judgements, the IRC mode or HRC mode will be determined. Also, in the step S23', in case the above mentioned provisional judgments are of STD signals, the STD judgment in the provisional judgment will include the case that no broadcast signal is present in the 5CH and 6CH and will be provisionally of the STD and therefore, in the next step S24', signals are searched also on the others than the 5CH and 6CH. In the signal search in the step S24', on the basis of the results of the signal seeking in the steps S18 and S20, the signal in the signal having CH is searched. The signal searching range is (fSTD±2.5 MHz). When a signal is present in the signal having CH, it is judged whether the signal is an HRC signal or not (step S25'). That is to say, it is judged whether the signal tunes with (fSTD−1.25 MHz) or not. If the frequency of the HRC signal is confirmed, the HRC mode will be determined (step S27) but, if the frequency is not of the HRC signal, the STD mode will be determined (step S28). The other steps are the same as in FIG. 1.

Also, in the embodiment in FIG. 3, both of setting the receiving mode and setting (judging whether signals are present or not) the CH data in that mode can be made simultaneously and automatically.

Figure 4:
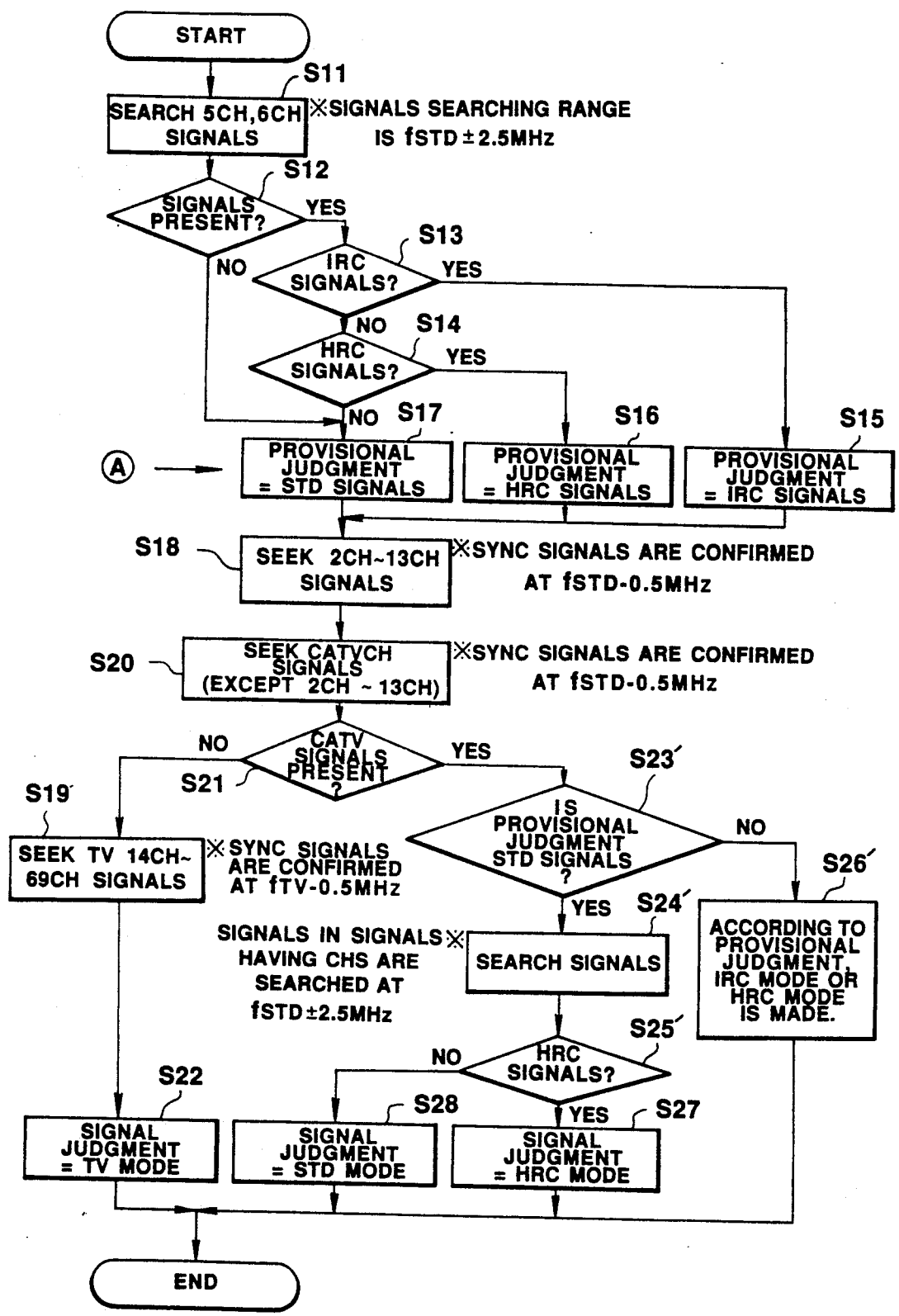
FIG. 4 is a flow chart for explaining the fourth embodiment of the processing operation in the channel selecting apparatus according to the present invention.

By the way, even in the embodiment in FIG. 3, the same as in the case of FIG. 1, the operation of the reference symbol B corresponding to the step S19 can be in the position shown by the reference symbol C. Its flow chart is shown as of the fourth embodiment in FIG. 4. The embodiment in FIG. 4 is not different from that in FIG. 3 except that the step S19 is arranged as the step S19' after the judgment of whether the CATV signal is present or not by the step S21. Therefore, also in the embodiment in FIG. 4, both of setting the receiving mode and setting (judging whether signals are present or not) the CH data in that mode can be made simultaneously and automatically.

As described above, according to the present invention, even if the user does not know the mode (system) of the broadcast signal input into the antenna terminal, the receiving mode can be automatically investigated and set. Therefore, a channel selecting apparatus very high in the operatability can be provided.

By the way, in the above mentioned embodiments, channel selecting apparatus for television receiving apparatus have been explained. However, the present invention can be used for selecting channels for not only television receiving apparatus but also, for example, VTR's (video tape recorders).

By the way, the present invention is not limited to only the above mentioned embodiments but can be variously modified in the range not deviating from the subject matter of the invention.

What is claimed is:

1. A channel selecting apparatus comprising:
   a tuner selectively amplifying a television signal fed to an antenna terminal and converting a frequency thereof;
   a video intermediate frequency circuit amplifying and detecting a signal from the tuner, and producing an AFT signal and synchronizing signal;
   a channel selecting circuit selecting a specific television signal for said tuner;
   an input circuit giving a channel selecting instruction to said channel selecting circuit;
   memory means for storing data required to select the channel; and
   operating means for providing channel selecting data to said channel selecting circuit by using said channel selecting instruction from said input circuit and said AFT signal and synchronizing signal from said video intermediate frequency circuit and for commanding storing of said channel data which is indicative of whether signals are present for selecting any channel in said memory means, the television signal to be fed to said tuner being tuned using said AFT signal and synchronizing signal, then a received frequency being confirmed and analyzed, the broadcasting mode of the television signal input into said antenna terminal being judged from characteristics of the received frequency, wherein said operating means comprises:
   means for searching television signals of a 5-channel and a 6-channel band in each of a TV, STD, HRC and IRC mode, respectively;
   means for determining whether signals are present in the 5-channel/6-channel band on the basis of said searching;
   means for determining whether a frequency tuning with an IRC signal is present using said AFT signal and said synchronizing signal when said signals are present in the 5-channel/6-channel band;
   means for determining whether a frequency tuning with an HRC signal is present using said AFT signal and said synchronizing signal when signals are present in the 5-channel/6-channel band;
   means for provisionally judging an STD signal when no signal is present in the 5-channel/6-channel band and no IRC signal and HRC signal are present, and for judging an IRC signal when an IRC signal is present and an HRC signal when an HRC signal is present;
   means for seeking signals at a predetermined frequency in a 2-channel to 13-channel band;
   means for seeking signals at a predetermined frequency in a 14-channel to 69-channel band;
   means for seeking signals at a predetermined frequency in a cable TV (CATV) channel other than the 2-channel to 13-channel band;
   means for determining whether a CATV signal is present on the basis of said seeking signals in said CATV channel band;
   means for searching signals within a predetermined frequency band in a signal having channels based on said seeking said signals when said CATV signals are present;
   means for determining whether a frequency tuning with an IRC signal is present using said AFT signal and synchronizing signal at the time of searching said signals while said CATV signals are present;
   means for determining whether a frequency tuning with an HRC signal is present by using said AFT signal and synchronizing signal when searching said signals while said CATV signals are present; and
   mode judging means for judging a TV mode when no CATV signal is present, judging an IRC mode when an IRC signal is present and a CATV signal is present, judging an HRC mode when an HRC signal is present and a CATV signal is present and judging an STD mode when no IRC signal and no HRC signal are present and a CATV signal is present.

2. A channel selecting apparatus comprising:

a tuner selectively amplifying a television signal fed to an antenna terminal and converting a frequency thereof;

a video intermediate frequency circuit amplifying and detecting a signal from the tuner, and producing an AFT signal and synchronizing signal;

a channel selecting circuit selecting a specific television signal for said tuner;

an input circuit giving a channel selecting instruction to said channel selecting circuit;

memory means for storing data required to select the channel; and operating means for providing channel selecting data to said channel selecting circuit by using said channel selecting instruction from said input circuit and said AFT signal and synchronizing signal from said video intermediate frequency circuit and for commanding storing of said channel data which is indicative of whether signals are present for selecting any channel in said memory means, the television signal to be fed to said tuner being tuned using said AFT signal and synchronizing signal, then a received frequency being confirmed and analyzed, the broadcasting mode of the television signal input into said antenna terminal being judged from characteristics of the received frequency, wherein said operating means comprises:

means for searching television signals within a predetermined band of a 5-channel and 6-channel band in each of a TV, STD, HRC, and IRC mode, respectively;

means for determining whether signals are present in the 5-channel/6-channel band on the basis of said searching said signals;

means for determining whether a frequency tuning with an IRC signal is present using said AFT signal and said synchronizing signal when signals are determined to be present in the 5-channel/6-channel band;

means for determining whether a frequency tuning with an HRC signal is present using said AFT signal and synchronizing signal when signals are present in the 5-channel/6-channel band;

means for provisionally judging an STD signal when no signal is present in the 5-channel/6-channel band and when no IRC signal and HRC signal are present, for judging and IRC signal when an IRC signal is present and for judging an HRC signal when an HRC signal is present;

first seeking means for seeking signals at a predetermined frequency in a 2-channel to 13-channel band;

second seeking means for seeking signals at a predetermined frequency in a cable television (CATV) channel band other than the 2-channel to 13-channel band;

means for determining whether a CATV signal is present based on said seeking signals in said CATV channel band by said first and second seeking means;

third seeking means for seeking signals at a predetermined frequency in a 14-channel to 69-channel band when no CATV signal is present;

means for searching signals within a predetermined frequency band in a signal having channels based on said seeking said signals when a CATV signal is present;

means for determining whether a frequency tuning with an IRC signal is present by using said AFT signal and said synchronizing signal when searching said signals while said CATV signals are present;

means for determining whether a frequency tuning with an HRC signal is present using said AFT signal and said synchronizing signal when searching said signals while said CATV signals are present;

mode judging means for judging a TV mode when no CATV signal is present, judging an IRC mode when an IRC signal is present and a CATV signal is not present, judging an HRC mode when an HRC signal is present and no CATV signal is present and judging an STD mode when no IRC signal and HRC signal are not present and a CATV signal is present.

3. A channel selecting apparatus comprising:

a tuner selectively amplifying a television signal fed to an antenna terminal and converting a frequency thereof;

a video intermediate frequency circuit amplifying and detecting a signal from the tuner, and producing an AFT signal and synchronizing signal;

a channel selecting circuit selecting a specific television signal for said tuner;

an input circuit giving a channel selecting instruction to said channel selecting circuit;

memory means for storing data required to select the channel; and operating means for providing channel selecting data to said channel selecting circuit by using said channel selecting instruction from said input circuit and said AFT signal and synchronizing signal from said video intermediate frequency circuit and for commanding storing of said channel data which is indicative of whether signals are present for selecting any channel in said memory means, the television signal to be fed to said tuner being tuned using said AFT signal and synchronizing signal, then a received frequency being confirmed and analyzed, the broadcasting mode of the television signal input into said antenna terminal being judged from characteristics of the received frequency, wherein said operating means comprises:

means for searching television signals of a 5-channel and 6-channel band in each of a TV, STD, HRC and IRC mode, respectively;

means for determining whether signals are present in the 5-channel/6-channel based based on said searching said signals;

means for determining whether a frequency tuning with an IRC signal is present using said AFT signal and said synchronizing signal when signals are present in the 5-channel/6-channel band;

means for determining whether a frequency tuning with an HRC signal is present using said AFT signal and said synchronizing signal when signals are present in the 5-channel/6-channel band;

means for provisionally judging an STD signal when no signal is present in the 5-channel/6-channel band and no IRC signal and HRC signal are present, judging an IRC signal when an IRC signal is present and judging an HRC signal when an HRC signal is present;

first seeking means for seeking signals at a predetermined frequency in a 2-channel to 13-channel band;

second seeking means for seeking signals at a predetermined frequency in a 14-channel to 69-channel band;

third seeking means for seeking signals at a predetermined frequency in a cable television (CATV) channel band other than the 2-channel to 13-channel band;

means for determining whether a CATV signal is present based on said seeking signals in said CATV channel band by said first, second and third seeking means;

means for determining whether the provisional judgment of said provisionally judging means is of an STD signal when a CATV signal is present;

a means of searching signals having channels within a predetermined frequency band on the basis of the results of seeking said signals when the provisional judgment of said provisionally judging means is of an STD signal;

means for determining whether a frequency tuning with an HRC signal is present using said AFT signal and said synchronizing signal at the time of searching said signals while said CATV signals are present; and mode judging means for determining a TV mode when no CATV signal is present, judging an IRC mode or HRC mode according to the provisional judgment of said provisionally judging means when the provisional judgment of said provisionally judging means is not of an STD signal when a CATV signal is present, judging an HRC mode when an HRC signal is present and a CATV signal is present and judging an STD mode when no HRC is present and a CATV signal is present.

4. A channel selecting apparatus comprising:

a tuner selectively amplifying a television signal fed to an antenna terminal and converting a frequency thereof;

a video intermediate frequency circuit amplifying and detecting a signal from the tuner, and producing an AFT signal and synchronizing signal;

a channel selecting circuit selecting a specific television signal for said tuner;

an input circuit giving a channel selecting instruction to said channel selecting circuit;

memory means for storing data required to select the channel; and operating means for providing channel selecting data to said channel selecting circuit by using said channel selecting instruction from said input circuit and said AFT signal and synchronizing signal from said video intermediate frequency circuit and for commanding storing of said channel data which is indicative of whether signals are present for selecting any channel in said memory means, the television signal to be fed to said tuner being tuned using said AFT signal and synchronizing signal, then a received frequency being confirmed and analyzed, the broadcasting mode of the television signal input into said antenna terminal being judged from characteristics of the received frequency, wherein said operating means comprises:

means for searching television signals within a predetermined frequency band in a 5-channel and 6-channel band;

means for determining whether signals are present in the 5-channel and 6-channel bands based on said searching signals;

means for determining whether a frequency tuning with an IRC signal is present using said AFT signal and said synchronizing signal when signals are present in the 5-channel/6-channel band;

means for determining whether a frequency tuning with an HRC signal is present using said AFT signal and said synchronizing signal when signals are present in the 5-channel/6-channel band;

means for provisionally judging an STD signal when no signal is present in the 5-channel/6-channel band and no IRC signal and HRC signal are present, judging an IRC signal when an IRC signal is present and judging an HRC signal when an HRC signal is present;

first seeking means for seeking signals at a predetermined frequency in a 2-channel to 13-channel band;

second seeking means for seeking signals at a predetermined frequency in a cable television (CATV) channel band other than the 2-channel to 13-channel band;

means for determining whether a CATV signal is present based on said seeking signals in said CATV channels by said first and second seeking means;

third seeking means for seeking signals at a predetermined frequency in a 14-channel to 69-channel band of the TV when no CATV signal is present;

means for determining whether the provisional judgment of said provisionally judging means is of an STD signal when a CATV signal is present;

means for searching signals within a predetermined frequency band in a signal having channels on the basis of the results of seeking said signals when the provisional judgment of said provisionally judging means is of an STD signal;

means for determining whether a frequency tuning with an HRC signal is present using said AFT signal and said synchronizing signal at a time of searching said signals if the CATV signals are present; and mode judging means for judging a TV mode when no CATV signal is present, judging an IRC mode or HRC mode according to the provisional judgment of said provisionally judging means if the provisional judgment of said provisionally judging means is not of an STD signal and a CATV signal is present, judging an HRC mode when an HRC signal is present and a CATV signal is present and judging an STD mode when no HRC signal is present and a CATV signal is present.

5. A channel selecting apparatus which operates to receive television signals defined by a plurality of broadcasting modes and signals of predetermined channels in the respective modes, comprising:

an input circuit for providing a channel selection instructing signal indicative of a commanded channel;

a channel selecting circuit receiving channel selection instructing data, for providing a control signal for selecting a signal of a predetermined channel;

a tuner receiving said control signal from said channel selecting circuit, and to which television signals defined by any of said modes are input, said tuner amplifying signals of channels selected by said control signal and producing output signals which are converted in frequency;

a video signal processing circuit which amplifies and detects said output signals from said tuner, to produce detected signals, automatic fine tuning (AFT) signals and synchronizing signals as an output;

a memory means for storing data necessary to select said predetermined channel; and operating means, connected to said memory means and connected between said input circuit and said channel selecting circuit, for:

1) providing said channel selection instructing data to said channel selecting circuit based on the channel selection instructing signal from said input circuit and the AFT signals and synchronizing signals from said video signal processing circuit, 2) varying said channel selection instructing data to said channel selecting circuit, and monitoring said tuner to confirm at which frequencies, within a predetermined first frequency band within which said predetermined channel is located, said television signal exists and, 3) responsive to said varying and monitoring, for determining in which mode among said plurality of broadcasting modes the television signal of the frequency is defined and for using the data stored in said memory means in accordance with a determined mode.

* * * * *